(12) United States Patent
Hong et al.

(10) Patent No.: US 11,410,605 B2
(45) Date of Patent: Aug. 9, 2022

(54) ORGANIC LIGHT EMITTING DISPLAY DEVICE HAVING IMPROVED PIXEL STRUCTURE CONFIGURATION

(71) Applicant: LG DISPLAY CO., LTD., Seoul (KR)

(72) Inventors: Soonhwan Hong, Paju-si (KR); Cheolhwan Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/681,619

(22) Filed: Nov. 12, 2019

(65) Prior Publication Data

US 2020/0152130 A1 May 14, 2020

(30) Foreign Application Priority Data

Nov. 12, 2018 (KR) .................. 10-2018-0138090

(51) Int. Cl.
| | |
|---|---|
| *G09G 3/3258* | (2016.01) |
| *G09G 3/3233* | (2016.01) |
| *G09G 3/3275* | (2016.01) |
| *H01L 27/32* | (2006.01) |
| *H01L 27/12* | (2006.01) |

(52) U.S. Cl.
CPC ......... *G09G 3/3258* (2013.01); *G09G 3/3233* (2013.01); *G09G 3/3275* (2013.01); *H01L 27/3248* (2013.01); *H01L 27/3276* (2013.01); *G09G 2300/0426* (2013.01); *G09G 2300/0809* (2013.01); *G09G 2310/027* (2013.01); *G09G 2320/0233* (2013.01); *G09G 2320/045* (2013.01); *H01L 27/124* (2013.01)

(58) Field of Classification Search
CPC .. G09G 3/3275; G09G 3/3258; G09G 3/3233; G09G 2300/0861; G09G 2310/0256; G09G 2300/0809; G09G 2320/0238; G09G 2300/0426; G09G 2310/027; G09G 2300/0842; G09G 2320/0233; G09G 2320/045; G09G 2300/0819; G09G 2320/0295; H01L 27/3248; H01L 27/3276; H01L 27/124
See application file for complete search history.

(56) References Cited

U.S. PATENT DOCUMENTS

| | | | |
|---|---|---|---|
| 2017/0092200 A1* | 3/2017 | Park | ................... G09G 3/3233 |
| 2019/0096335 A1* | 3/2019 | Kim | ................... G09G 3/3291 |

FOREIGN PATENT DOCUMENTS

| | | |
|---|---|---|
| CN | 103165079 A | 6/2013 |
| CN | 107424566 A | 12/2017 |
| CN | 107424587 A | 12/2017 |
| CN | 107452338 A | 12/2017 |
| CN | 107564465 A | 1/2018 |
| KR | 10-2018-0081655 A | 7/2018 |

* cited by examiner

*Primary Examiner* — Yaron Cohen
(74) *Attorney, Agent, or Firm* — Birch, Stewart, Kolasch & Birch, LLP

(57) ABSTRACT

An organic light emitting display device can include an organic light emitting diode (OLED), a driving transistor connected to an anode electrode of the OLED, a scan transistor, a digital-to-analog converter (DAC) and a sensing unit. The scan transistor is connected the anode electrode of the OLED and a data line. The DAC supplies a data voltage for displaying to the data line in a displaying period and supplies a data voltage for sensing to the data line in a sensing period. The sensing unit obtains an anode voltage of the OLED as a sensing voltage through the data line in the sensing period.

16 Claims, 16 Drawing Sheets

ORGANIC LIGHT EMITTING DISPLAY DEVICE HAVING IMPROVED PIXEL STRUCTURE CONFIGURATION

This application claims the priority benefit of Korean Patent Application No. 10-2018-0138090 filed on Nov. 12, 2018 in the Republic of Korea, which is incorporated herein by reference for all purposes as if fully set forth herein.

BACKGROUND

Field

The present disclosure relates to an organic light emitting display device of an active matrix type.

Discussion of the Related Art

The organic light emitting display device of an active matrix type includes an organic light emitting diode (OLED) emitting light itself, and is advantageous in that response speed, luminous efficiency and luminance are high, and viewing angle is large.

The OLED which is a self light-emitting element includes anode and cathode electrodes and an organic compound layer formed therebetween. The organic compound layer comprises a hole injection layer, a hole transport layer, an emission layer, an electron transport layer, and an electron injection layer. When driving voltages are applied to the anode and cathode electrodes, the holes passing the hole transport layer and the electrons passing the electron transport layer move to form excitons, which causes the emission layer to emit visible light.

In the organic light emitting display device, pixels each including the OLED and a driving transistor are arranged in a matrix form, and control the luminance of input image according to the gray scale of image data. The driving transistor controls the driving current flowing through the OLED according to the potential difference between the gate and source electrodes of the driving transistor. The amount of the light emitted by the OLED is determined by the driving current, and image luminance is determined by the light amount emitted by the OLED.

The OLED is deteriorated as an emission time of the OLED increases. If the OLED is deteriorated, the threshold voltage capable of turning on the OLED increases and emission efficiency decreases. Since the cumulative emission time of the OLED can be different for each pixel, the deterioration of the OLED can be different for each pixel. The difference in the deterioration of the OLEDs between the pixels can cause a luminance variation and can result in image sticking phenomenon.

Accordingly, a deterioration compensation technique which determines whether the OLED is deteriorated by sensing the threshold voltage of the OLED and corrects image data with a compensation gain that can compensate for the deterioration of OLED has been used. In this regard, in order to simplify a pixel structure and realize a high-resolution display panel, it is necessary to simplify the structure for sensing the threshold voltage of the OLED.

SUMMARY

Therefore, it is an objective of the present disclosure to provide an organic light emitting display device which is advantageous in realizing a high resolution by simplifying a structure for sensing a threshold voltage of an organic light emitting diode.

The organic light emitting display device of the present disclosure can comprise an organic light emitting diode (OLED), a driving transistor connected to an anode electrode of the OLED, a scan transistor, a digital-to-analog converter (DAC) and a sensing unit. The scan transistor is connected the anode electrode of the OLED and a data line. The DAC supplies a data voltage for displaying to the data line in a displaying period and supplies a data voltage for sensing to the data line in a sensing period. The sensing unit obtains an anode voltage of the OLED as a sensing voltage through the data line in the sensing period.

Since the organic light emitting diode display device according to the present disclosure does not require additional patterns and switch elements and performs a sensing operation using only the configuration of an internal compensation circuit necessary during a displaying period, the pixel structure can be simplified.

Since a sensing voltage is obtained by using a data line, an initialization line can be disposed as a horizontal line. As a result, the design margin can be increased, which is advantageous in realizing a high resolution.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION OF THE EMBODIMENTS

Figure 1:
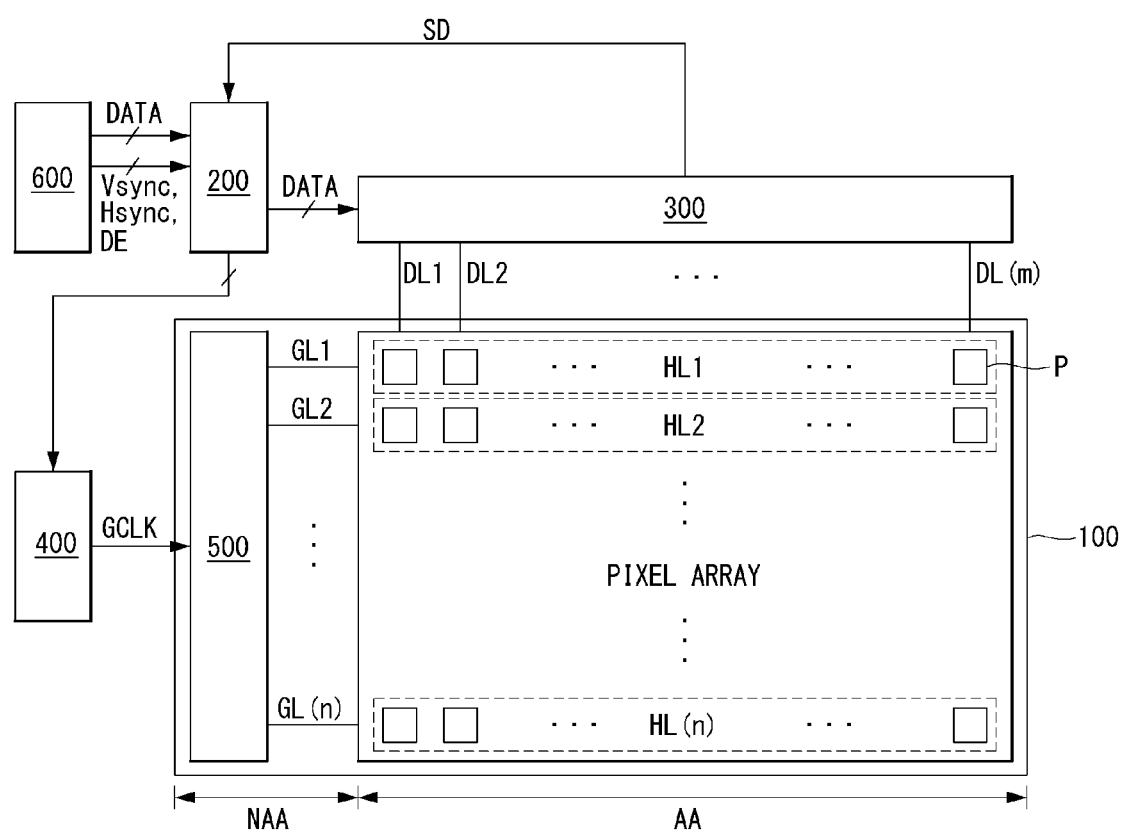
FIG. 1 is a view illustrating an organic light emitting display device according to an embodiment of the present disclosure.

Hereinafter, preferred embodiments of the present disclosure will be described in detail with reference to the accompanying drawings. The same reference numerals throughout the specification denote substantially identical components. In the following description, a detailed description of known functions and configurations incorporated herein will be omitted when it can make the subject matter of the present disclosure rather unclear.

Hereinafter, embodiments of the present disclosure will be described with reference to the drawings.

FIG. 1 is a view illustrating an organic light emitting display device according to an embodiment of the present disclosure. All the components of the organic light emitting display device according to all embodiments of the present disclosure are operatively coupled and configured.

Referring to FIG. 1, the organic light emitting display device according to an embodiment of the present disclosure includes a display panel 100, a data driver 300, gate drivers 400 and 500, and a timing controller 200.

In a display area AA of the display panel 100, a plurality of data lines DL1 to DLm and a plurality of gate lines GL1 to GLn cross each other, and pixels P are arranged in a matrix form. Each of pixel lines HL1 to HLn includes pixels arranged in a same row. When the number of the pixels P arranged in the display area AA is m×n, the display area AA includes n pixel lines. Herein, each of the pixels P refers to either a red subpixel, a green subpixel or a blue subpixel for color implementation, or can be another type such as a white subpixel. Each of the pixels P is supplied with a high-potential voltage VDD and a low-potential voltage ELVSS from a power generating unit. The pixels P arranged in a first pixel line HL1 are connected to a first gate line GL1 and the pixels P arranged in an n-th pixel line HLn are connected to an n-th gate line GLn. The gate lines GL1 to GLn can include a plurality of lines for providing respective gate signals.

The timing controller 200 generates data control signals for controlling the operation timing of the data driver 300 and gate control signals for controlling the operation timings of the gate drivers 400 and 500 based on timing signals such as a vertical synchronization signal Vsync, a horizontal synchronization signal Hsync, and a data enable signal DE supplied from a host 600.

The timing controller 200 generates a compensation value for compensating for a variation in deterioration of organic light emitting diodes OLEDs based on the sensing data SD provided from the data driver 300 in a sensing period. And the timing controller can correct image data based on the compensation value.

The data driver 300 supplies the data voltage for sensing to the pixels P, converts the sensing voltage input through the data line DL to a digital value and supplies it to the timing controller 200, during the sensing period. The data driver 300 supplies a data voltage for displaying to the data line DL during a displaying period.

The gate driver includes a level shifter 400 and a shift register 500. The level shifter 400 generates gate clocks GCLK based on the gate control signal provided from the timing controller 200. The shift register 500 outputs gate pulses based on the gate clocks GCLK output from the level shifter 500. To this end, the shift register 500 includes shift registers which are connected to each other in a dependent manner. The shift register 500 can be formed directly on a non-display area NAA of the display panel 100 in accordance with a gate-driver in panel GIP scheme.

Figure 2:
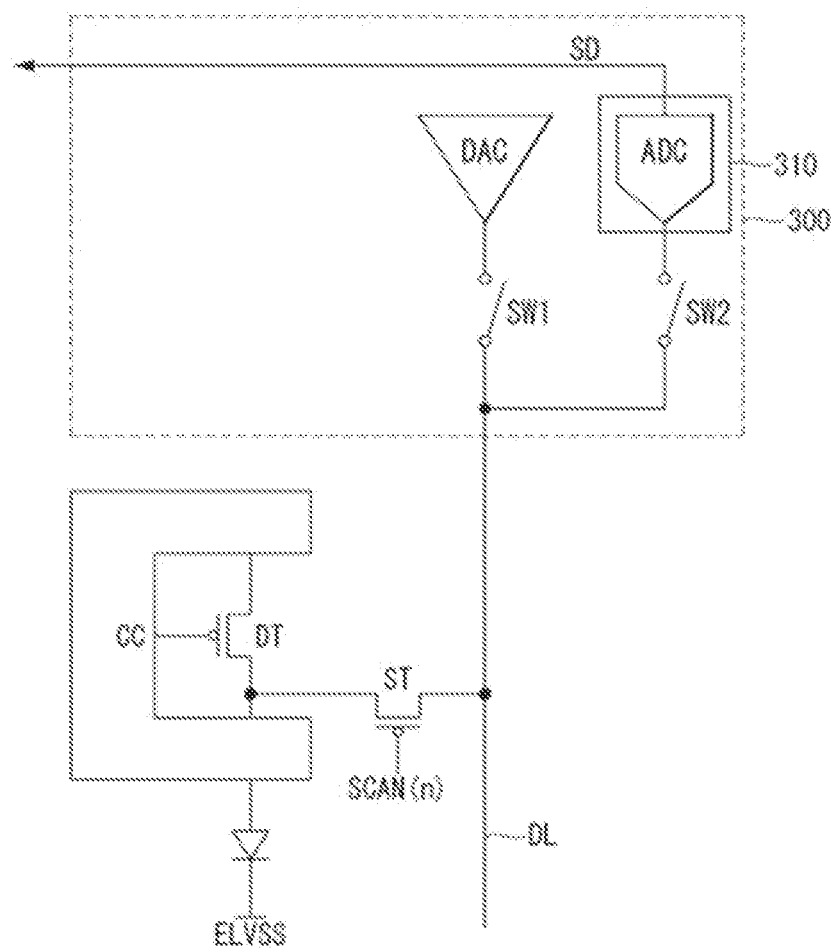
FIG. 2 illustrates a pixel circuit and a data driver according to the present disclosure.
Figure 3:
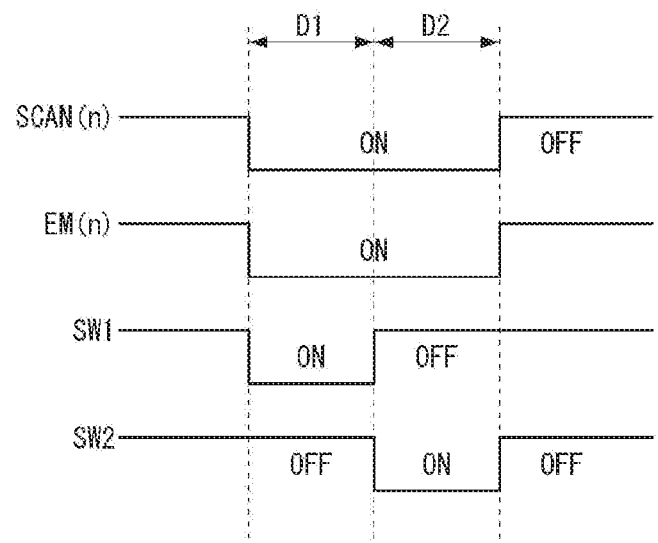
FIG. 3 is a diagram illustrating the operation of switch elements in a sensing period.

FIG. 2 illustrates an example of a pixel circuit and a data driver usable in the organic light emitting display device of FIG. 1 according to the present disclosure, and FIG. 3 is a diagram illustrating the operation timings of a scan transistor and first and second switch elements in a sensing period.

Referring to FIGS. 2 and 3, the pixel (e.g., P in FIG. 1) according to an embodiment of the present disclosure comprises an OLED, a driving transistor DT, a scan transistor Ts and a compensation circuit CC.

The OLED includes an organic compound layer positioned between an anode electrode and a cathode electrode. The driving transistor DT controls the driving current applied to the OLED according to its source-gate voltage Vsg. The scan transistor ST connects the anode electrode of the OLED and the data line DL in response to a scan signal SCAN(n). The data driver 300 includes a digital-to-analog converter DAC and a sensing unit 310. The DAC converts image data DATA into an analog-type data voltage to generate a data voltage Vdata.

The sensing unit 310 acquires the anode voltage of the OLED as a sensing voltage during a sensing period. The sensing unit 310 includes an analog-to-digital converter ADC for converting the sensing voltage into sensing data SD of a digital form.

A first switch SW1 selectively connects the DAC and the data line DL. The first switch SW1 maintains its turn-on state to provide the data voltage Vdata output from the DAC to the data line DL during the displaying period for displaying image. The first switch SW1 maintains its turn-on state to provide the data voltage Vdata output from the DAC to the data line DL during a first period D1 of the sensing period. The data voltage Vdata output by the DAC during the first period D1 of the sensing period corresponds to the data voltage for sensing.

A second switch SW2 selectively connects the ADC and the data line DL. The second switch SW2 is turned on to acquire the anode voltage of the OLED as the sensing voltage during a second period D2 within the sensing period.

The sensing period is a period during which a sensing operation is performed for sensing a threshold voltage of the OLED and compensating for a threshold voltage deviation of respective pixels. The sensing period can be included in a predetermined driving preparation period from when the display device is turned on or can be included in a period before the power is completely turned off by a power off signal.

Hereinafter, specific embodiments of the present disclosure will be described.

Figure 4:
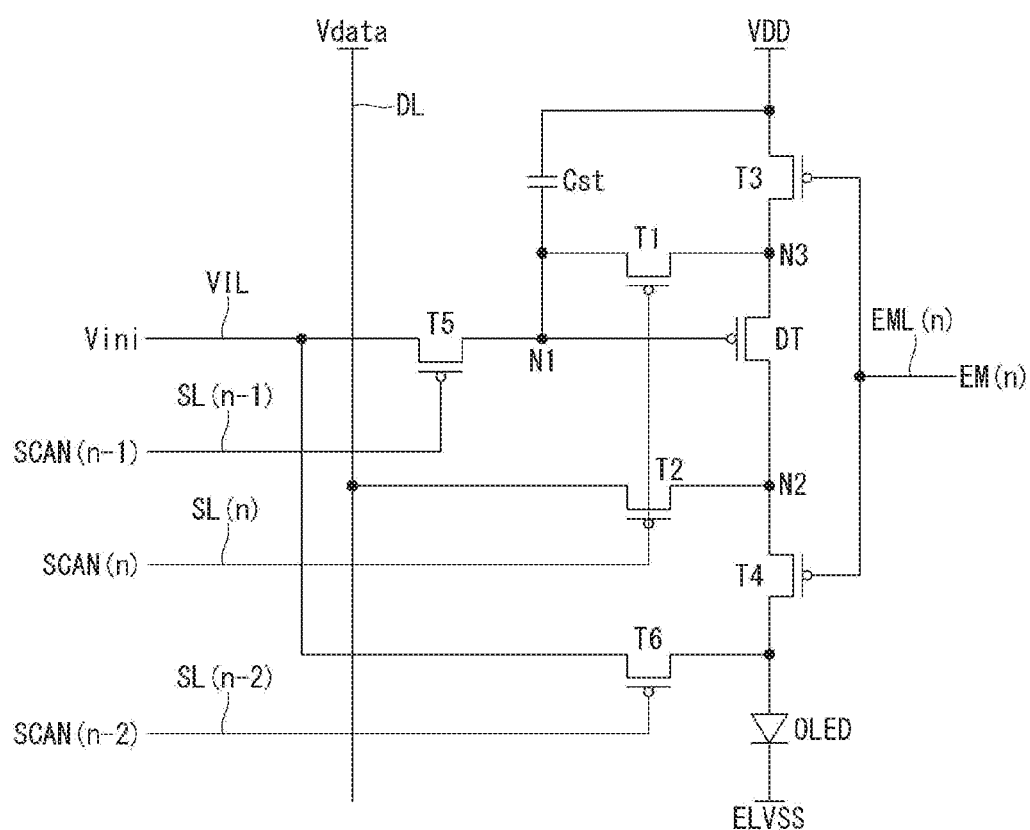
FIG. 4 is a diagram showing a pixel circuit according to a first embodiment of the present disclosure.

FIG. 4 is a diagram showing a pixel circuit according to a first embodiment of the present disclosure.

Referring to FIG. 4, the pixel (e.g., P in FIG. 1) according to the first embodiment includes an OLED, a driving transistor DT, a first transistor T1, a scan transistor T2, first and second emission control transistors T4 and T3, first and second initialization transistors T5 and T6 and a storage capacitor Cst.

The driving transistor DT controls the driving current applied to the OLED according to its source-gate voltage Vsg. In the driving transistor DT, a gate electrode is connected to a first node N1, a drain electrode is connected to a second node N2, and a source electrode is connected to the input terminal of a high potential voltage VDD through the second emission control transistor T3.

The first transistor T1 includes a gate electrode connected to an n-th scan line SL(n), a source electrode connected to a third node N3, and a drain electrode connected to the first node N1. The first transistor T1 connects the gate electrode and the drain electrode of the driving transistor DT in response to an n-th scan signal SCAN(n).

The scan transistor T2 (hereinafter referred to as a second transistor) includes a gate electrode connected to the n-th scan line SL(n), a source electrode connected to the data line DL, and a drain electrode connected to the second node N2.

The second transistor T2 connects the data line DL and the second node N2 in response to the n-th scan signal SCAN (n).

The first emission control transistor T4 (hereinafter referred to as a fourth transistor) includes a gate electrode connected to an n-th emission line EML(n), a source electrode connected to the second node N2, and a drain electrode connected to an anode electrode of the OLED. The fourth transistor T4 connects the anode electrode of the OLED with the second node N2 in response to the n-th emission signal EM(n).

The second emission control transistor T3 (hereinafter referred to as a third transistor) includes a gate electrode connected to the n-th emission line EML(n), a source electrode connected to the input terminal of the high potential voltage VDD, and a drain electrode connected to the third node N3. The third transistor T3 applies the high potential voltage VDD to the third node N3 in response to the n-th emission signal EM(n).

The first initialization transistor T6 (hereinafter, referred to as a sixth transistor) includes a gate electrode connected to an (n-2)-th scan line SL(n-2), a source connected to the anode of the OLED, and a drain electrode connected to an initialization line VIL. The sixth transistor T6 applies an initialization voltage Vini to the anode of the OLED in response to an (n-2)-th scan signal SCAN(n-2).

The second initialization transistor T5 (hereinafter, referred to as a fifth transistor) includes a gate electrode connected to an (n-1)-th scan line SL(n-1), a source connected to the first node N1, and a drain electrode connected to the initialization line VIL. The fifth transistor T5 applies the initialization voltage Vini to the first node N1 in response to an (n-1)-th scan signal SCAN(n-1).

The storage capacitor Cst includes a first electrode connected to the input terminal of the high potential voltage VDD and a second electrode connected to the first node N1.

The pixel circuit according to the first embodiment compensates the change of the threshold voltage of the driving transistor DT in real time within the displaying period according to an internal compensation scheme.

Figure 5:
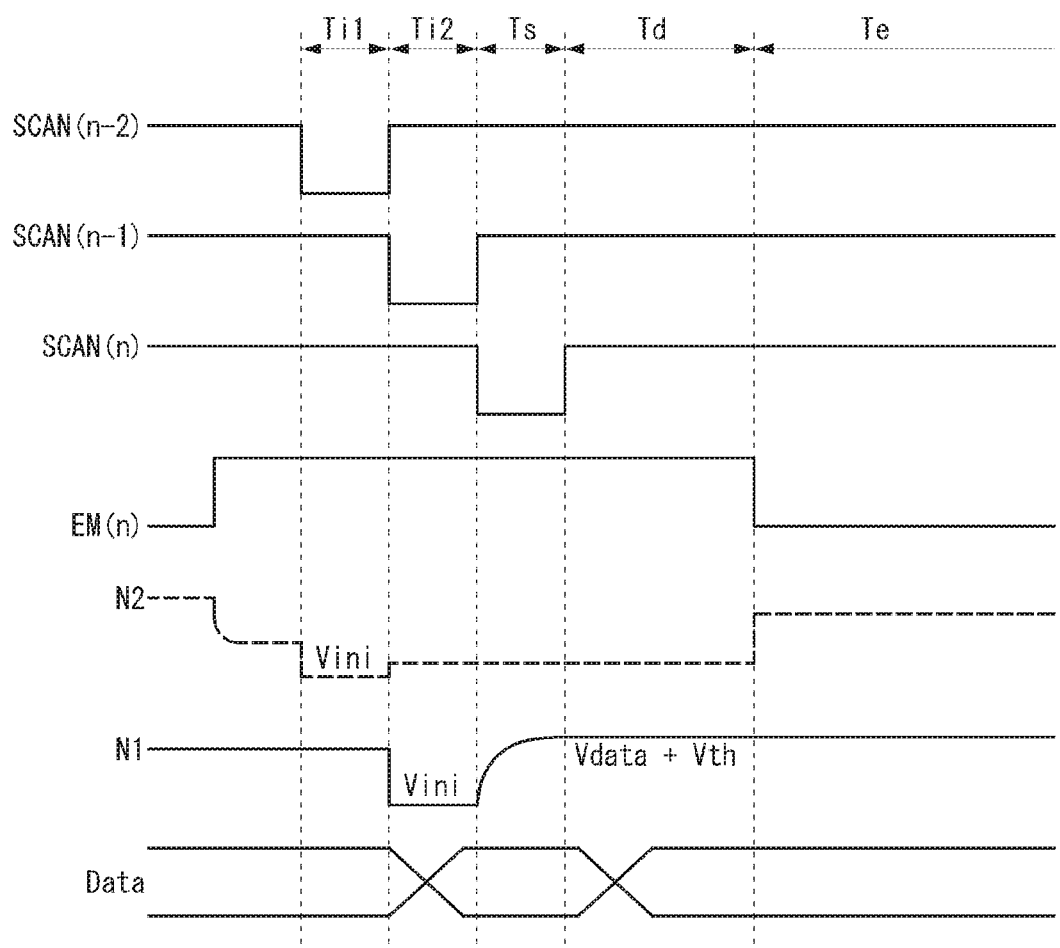
FIG. 5 is a diagram illustrating the operation timings of driving signals and the voltage changes of main nodes according to the first embodiment of the present disclosure.

FIG. 5 is a diagram illustrating the timings of gate signals in the displaying period according to the first embodiment, and FIGS. 6A to 6D are equivalent circuit diagrams of pixels in a first initialization period, a second initialization period, a sampling period, and a light emission period, respectively.

Referring to FIGS. 4 to 6D, the operations of the pixel is as follows which emits light while compensating for the threshold voltage change of the driving transistor in real time.

Figure 6A:
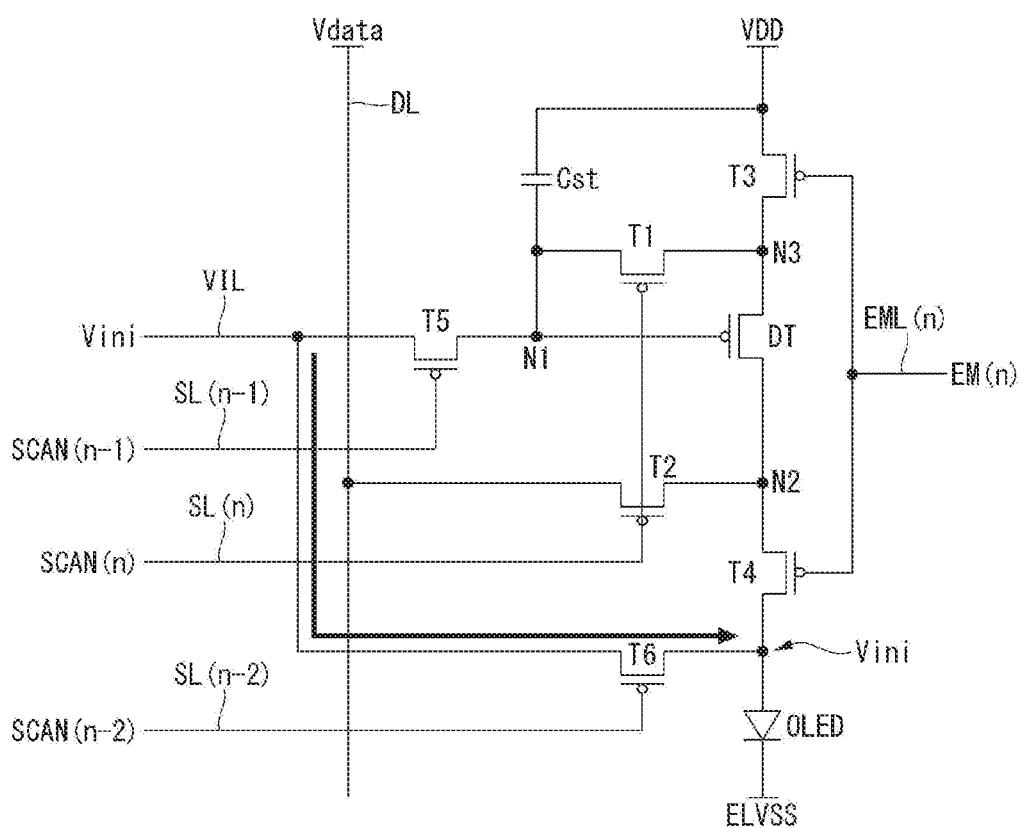
FIGS. 6A to 6D are views for explaining the operations of the first pixel circuit in an image displaying period.

Referring to FIGS. 4, 5 and 6A, in the first initialization period Ti1, the (n-2)-th scan signal SCAN(n-2) maintains a turn-on voltage. The sixth transistor T6 applies the initialization voltage Vini to the anode of the OLED in response to the (n-2)-th scan signal SCAN(n-2). As a result, the anode of the OLED is initialized to the initialization voltage Vini in the first initializing period Ti1. The initialization voltage Vini is selected within a voltage range sufficiently lower than the operation voltage of the OLED and can be set to be equal to or lower than the low potential voltage ELVSS.

Figure 6B:
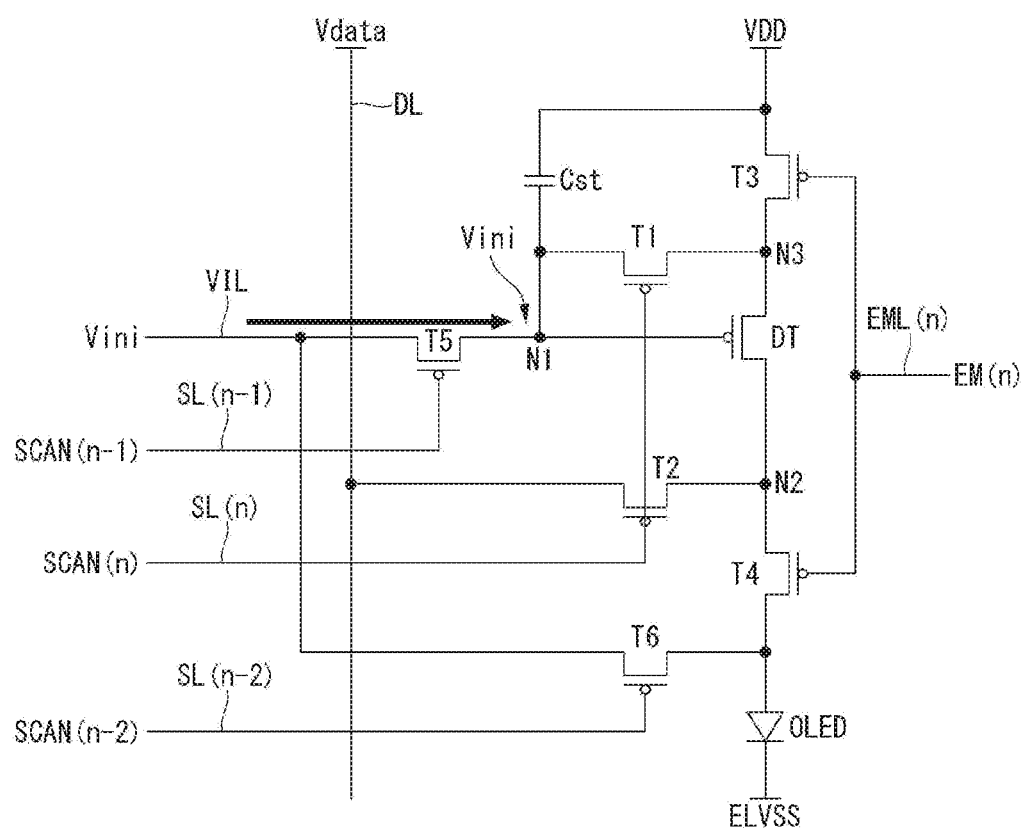

Referring to FIGS. 4, 5 and 6B, the (n-1)-th scan signal SCAN(n-1) maintains the turn-on voltage in the second initialization period Ti2. The fifth transistor T5 applies the initialization voltage Vini to the first node N1. In the second initializing period Ti2, the first node N1 is initialized to the initialization voltage Vini.

Figure 6C:
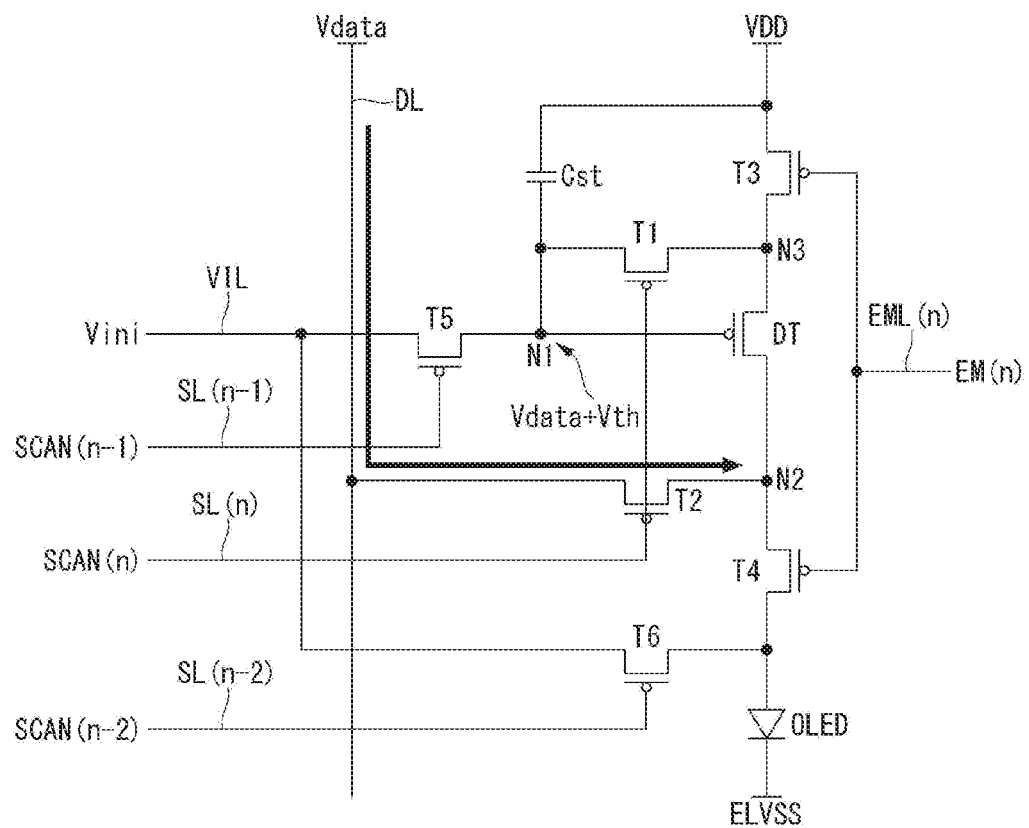

Referring to FIGS. 4, 5 and 6C, in the sampling period Ts, the n-th scan signal SCAN(n) maintains the turn-on voltage.

The first transistor T1 connects the first node N1 and the third node N3 in response to the n-th scan signal SCAN(n). The second transistor T2 writes a data voltage Vdata to the second node N2 in response to the n-th scan signal SCAN (n). A current flows between the drain and source electrodes of the driving transistor DT in the sampling period Ts, and this current flows until the voltage of the source electrode is saturated to the magnitude of the sum (Vdata+Vth) of the data voltage Vdata and the threshold voltage Vth of the driving transistor DT. That is, during the sampling period Ts, the gate electrode of the driving transistor DT is sampled with a magnitude of (Vdata+Vth).

Figure 6D:
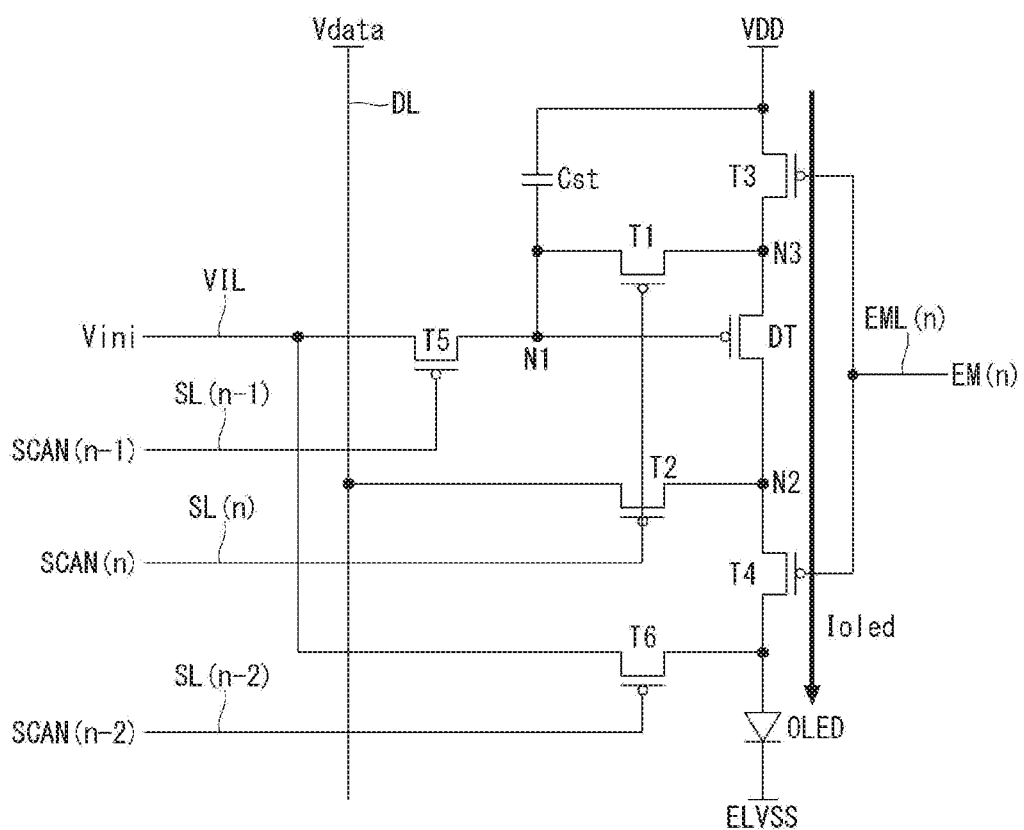

Referring to FIGS. 4, 5 and 6D, in the sampling period Ts, the n-th emission signal EM(n) maintains the turn-on voltage in the emission period Te after a holding period Td. The third transistor T3 and the fourth transistor T4 are turned on in response to the n-th emission signal EM(n), and as a result, a current is generated from the input terminal of the high potential voltage VDD to the anode of the OLED depending on the voltage set between the gate and the source of the driving transistor DT.

The driving current Ioled flowing in the OLED in the emission period Te is as shown in the following Equation 1.

$$IOLED = k/2\{(Vgs-Vth)\}^2 = k/2\{(Vg-Vs-Vth)\}^2 = k/2\{(Vdata+Vth)-VDD-Vth)\}^2 \quad \text{Equation 1}$$

At this time, since Vth<0, Equation 1 becomes $k/2\{(Vdata-VDD)\}^2$.

In Equation 1, k represents a proportional constant determined by electron mobility, parasitic capacitance, and channel capacitance of the driving transistor DT, and the like. As a result, during the light emission period Te, the driving current flowing through the OLED is not affected by the threshold voltage Vth of the driving transistor DT.

The pixel circuit according to the first embodiment compensates for the threshold voltage deviation of the OLED within the sensing period.

Referring to FIGS. 2, 3 and 5, the process of sensing the threshold voltage of the OLED in the pixel circuit according to the first embodiment will be described.

During the first period D1 to the second period D2, the second transistor T2 maintains a turn-on state in response to the n-th scan signal SCAN(n), and the fourth transistor T4 maintain the turn-on state in response to the n-th emission signal EM(n).

During the first period D 1, the first switch SW1 is turned on and the data line DL is connected to the DAC of the data driver 300. The data driver 300 outputs the data voltage for sensing through the DAC. The data voltage for sensing is set to a voltage value sufficiently higher than the threshold voltage of the OLED.

The data voltage for sensing Vdata output from the DAC is applied to the anode of the OLED via the second transistor T2 and the fourth transistor T4.

During the second period D2, the second switch SW2 is turned on, and the data line DL is connected to the ADC. In the second period D2, the OLED emits light, and the anode voltage of the OLED gradually decreases because it is discharged through OLED. The anode voltage of the OLED is discharged until it reaches the threshold voltage of the OLED. The ADC senses the threshold voltage of the OLED through the data line DL.

As described above, the organic light emitting display device according to the first embodiment senses the threshold voltage of the OLED through the data line DL directly connected to the anode electrode of the OLED. Advantages of obtaining the sensing voltage through the current path as in the first embodiment are as follows.

Since the sensing operation must be performed for each pixel, each pixel must be connected to the ADC through a vertical line such as the data line DL.

Since the pixel circuit for internal compensation of a conventional organic light emitting display device writes a data voltage to the gate electrode or the source electrode of the driving transistor DT, the data line DL is connected to the gate electrode or the source electrode of the driving transistor. Therefore, in the conventional organic light emitting display device, the driving transistor DT is located between the data line DL and the anode electrode of the OLED.

In a conventional method of obtaining the anode voltage of the OLED, the shortest path between the anode electrode of the OLED and the data line DL sequentially passes through the driving transistor DT, the second transistor T2 and the data line DL. However, the driving transistor DT is arranged in this sensing path. When the voltage of the anode electrode of the OLED is sensed by the current path passing through the driving transistor DT, the threshold voltage of the driving transistor DT affects the sensing voltage. That is, sensing accuracy is lowered Therefore, a path is required to bypass the driving transistor DT to connect the anode electrode of the OLED and the data line DL. Thus, there is a disadvantage that additional switching elements and conductive patterns are required to use the bypass path.

A method of connecting a vertical line other than the data line, for example, the initialization line to the anode electrode of the driving transistor DT and acquiring the sensing voltage through the initialization line can be used in a method that does not use the bypass path. However, in addition to the high potential voltage line supplying the high potential voltage VDD and the data line DL, arranging the initialization line as vertical lines increases the vertical width of the pixels, which is very disadvantageous for realizing high resolution.

On the other hand, the organic light emitting display device according to the first embodiment can perform the sensing operation using only the configuration of the internal compensation circuit which is necessary during the displaying period, without requiring additional patterns and switch elements.

In addition, according to the first embodiment of the present disclosure, since the sensing voltage is obtained by using the data line DL, the initialization line can be arranged as a horizontal line. Since a longitudinal width is wider than a lateral width in the shape of the pixel, the design margin is larger when the initialization line is arranged as the horizontal line, which is advantageous for realizing high resolution.

In order to drive the pixels arranged in the n-th pixel line in the first embodiment, three scan signals, namely, the (n-2)-th scan signal SCAN(n-2), the (n-1)-th scan signal SCAN(n-1) and the n-th scan signal SCAN(n) are required. That is, in a general pixel array structure, three scan lines must be arranged in one pixel line. In order to reduce the number of scan lines arranged in a pixel line, the pixel array can have the following structure.

Figure 7:
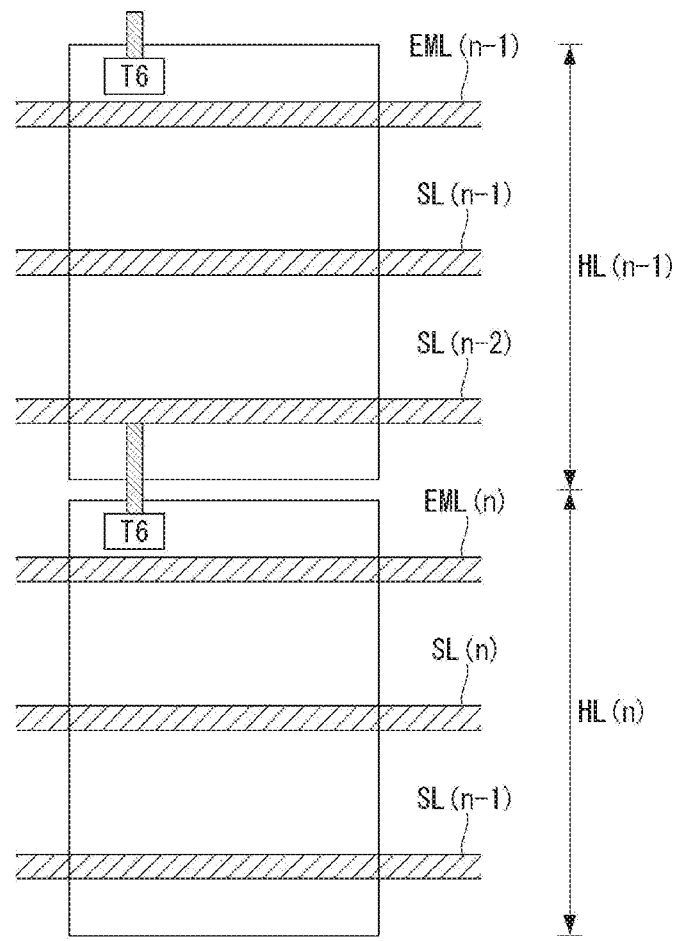
FIG. 7 is a schematic diagram of pixels according to the first embodiment of the present disclosure.

FIG. 7 is a schematic diagram of pixels according to the first embodiment of the present disclosure.

Referring to FIG. 7, in a (n-1)-th pixel line HL(n-1), a (n-1)-th emission line EML(n-1), a (n-1)-th scan line SL(n-1) and a (n-2)-th scan line SCAN(n-2) are sequentially arranged. In a n-th pixel line HL(n), a n-th emission line EML(n), a n-th scan line SL(n) and the (n-1)-th scan line SCAN(n-1) are sequentially arranged. The gate electrode of the sixth transistor T6 of the pixels arranged in the n-th pixel line HL(n) is connected to the (n-2)-th scan line SL(n-2) arranged at the lowermost end of the (n-1)-th pixel line HL(n-1). As a result, the n-th pixel line HL(n) does not need to be arranged with the (n-2)-th scan line SL(n-2), which makes it easy to design a pixel structure.

Figure 8:
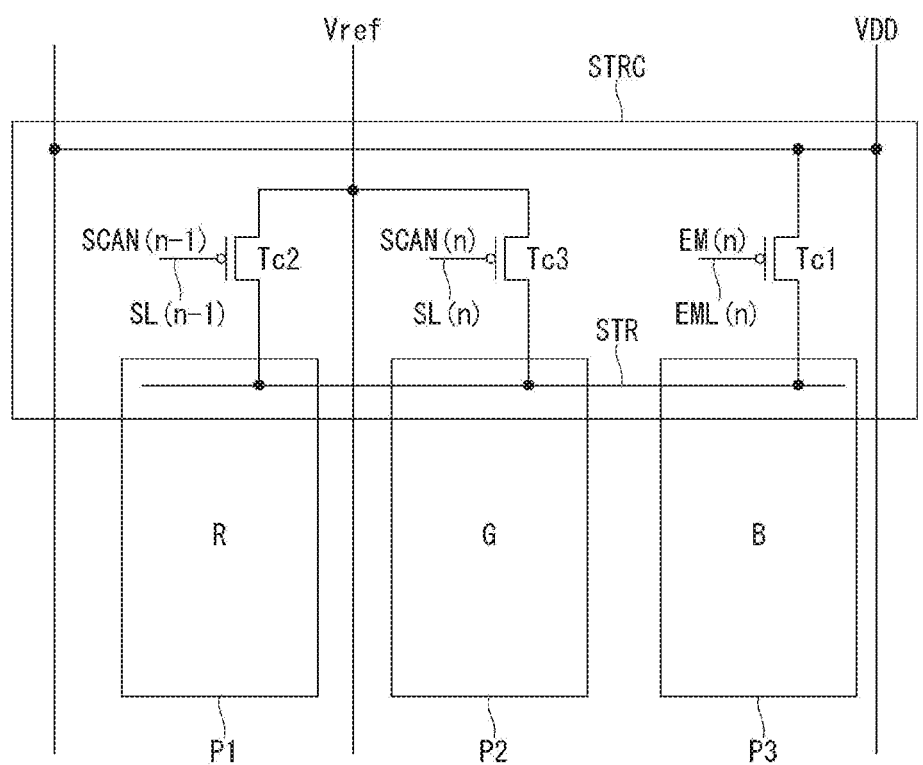
FIG. 8 is a diagram showing an array structure of pixels according to a second embodiment of the present disclosure.
Figure 9:
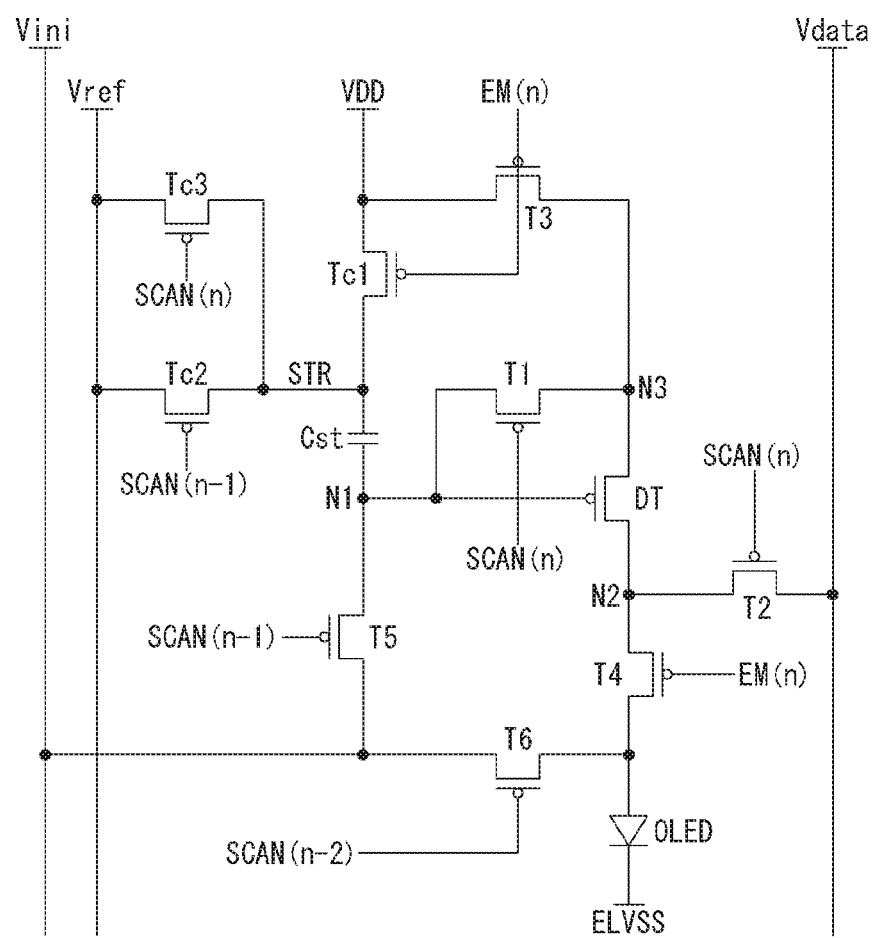
FIG. 9 is a diagram showing a pixel circuit according to the second embodiment of the present disclosure.

FIG. 8 is a diagram showing an array structure of pixels according to a second embodiment of the present disclosure, and FIG. 9 is a diagram showing a pixel circuit according to the second embodiment. These configurations of the pixels of FIGS. 8 and 9 can be used in the display device of FIG. 1 or other suitable display devices.

Referring to FIGS. 8 and 9, first through third pixels P1, P2, and P3 representing R, G, and B colors share a compensation node STR. A voltage drop compensation unit STRC controls the compensation node STR to compensate for the voltage drop of the high potential voltage VDD between the pixel lines.

Each of the first through third pixels P1, P2, and P3 includes a driving transistor DT, first to sixth transistors T1 to T6, and a storage capacitor Cst.

The driving transistor DT controls the driving current applied to the OLED according to its source-gate voltage Vsg. In the driving transistor DT, a gate electrode is connected to a first node N1, a drain electrode is connected to a second node N2, and a source electrode is connected to the input terminal of a high potential voltage VDD.

The first transistor T1 includes a gate electrode connected to an n-th scan line SL(n), a source electrode connected to a third node N3, and a drain electrode connected to the first node N1. The first transistor T1 connects the gate electrode and the drain electrode of the driving transistor DT in response to an n-th scan signal SCAN(n).

A second transistor T2 includes a gate electrode connected to the n-th scan line SL(n), a source electrode connected to the data line DL, and a drain electrode connected to the second node N2. The second transistor T2 connects the data line DL and the second node N2 in response to the n-th scan signal SCAN(n).

A third transistor includes a gate electrode connected to the n-th emission line EML(n), a source electrode connected to the input terminal of the high potential voltage VDD, and a drain electrode connected to the third node N3. The third transistor T3 applies the high potential voltage VDD to the third node N3 in response to the n-th emission signal EM(n).

A fourth transistor includes a gate electrode connected to an n-th emission line EML(n), a source electrode connected to the second node N2, and a drain electrode connected to an anode electrode of the OLED. The fourth transistor T4 connects the anode electrode of the OLED with the second node N2 in response to the n-th emission signal EM(n).

A fifth transistor includes a gate electrode connected to an (n-1)-th scan line SL(n-1), a source connected to the first node N1, and a drain electrode connected to the initialization line VIL. The fifth transistor T5 applies the initialization voltage Vini to the first node N1 in response to an (n-1)-th scan signal SCAN(n-1).

A sixth transistor includes a gate electrode connected to an (n-2)-th scan line SL(n-2), a source connected to the anode of the OLED, and a drain electrode connected to an initialization line VIL. The sixth transistor T6 applies an initialization voltage Vini to the anode of the OLED in response to an (n-2)-th scan signal SCAN(n-2).

The storage capacitor Cst is connected between the first node N1 and the compensation node STR.

The voltage drop compensation unit STRC includes first to third compensation transistors Tc1, Tc2 and Tc3.

The first compensation transistor Tc1 includes a gate electrode connected to the n-th emission line EML(n), a source electrode connected to the input terminal of the high potential voltage VDD, and a drain electrode connected to the compensation node STR. The first compensation transistor Tc1 applies the high potential voltage VDD to the compensation node STR in response to the n-th emission signal EM(n).

The second compensation transistor Tc2 includes a gate electrode connected to the (n-1)-th scan line SL(n-1), a source electrode connected to the compensation node STR, and a drain electrode connected to an input terminal of a reference voltage Vref. The second compensation transistor Tc2 applies the reference voltage Vref to the compensation node STR in response to the (n-1)-th scan signal SCAN(n-1).

The third compensation transistor Tc3 includes a gate electrode connected to the n-th scan line SL(n), a source electrode connected to the compensation node STR, and a drain electrode connected to an input terminal of a reference voltage Vref. The third compensation transistor Tc3 applies the reference voltage Vref to the compensation node STR in response to the n-th scan signal SCAN(n).

The pixel circuit according to the second embodiment compensates the change of the threshold voltage of the driving transistor DT in real time within the displaying period according to the internal compensation scheme.

Figure 10:
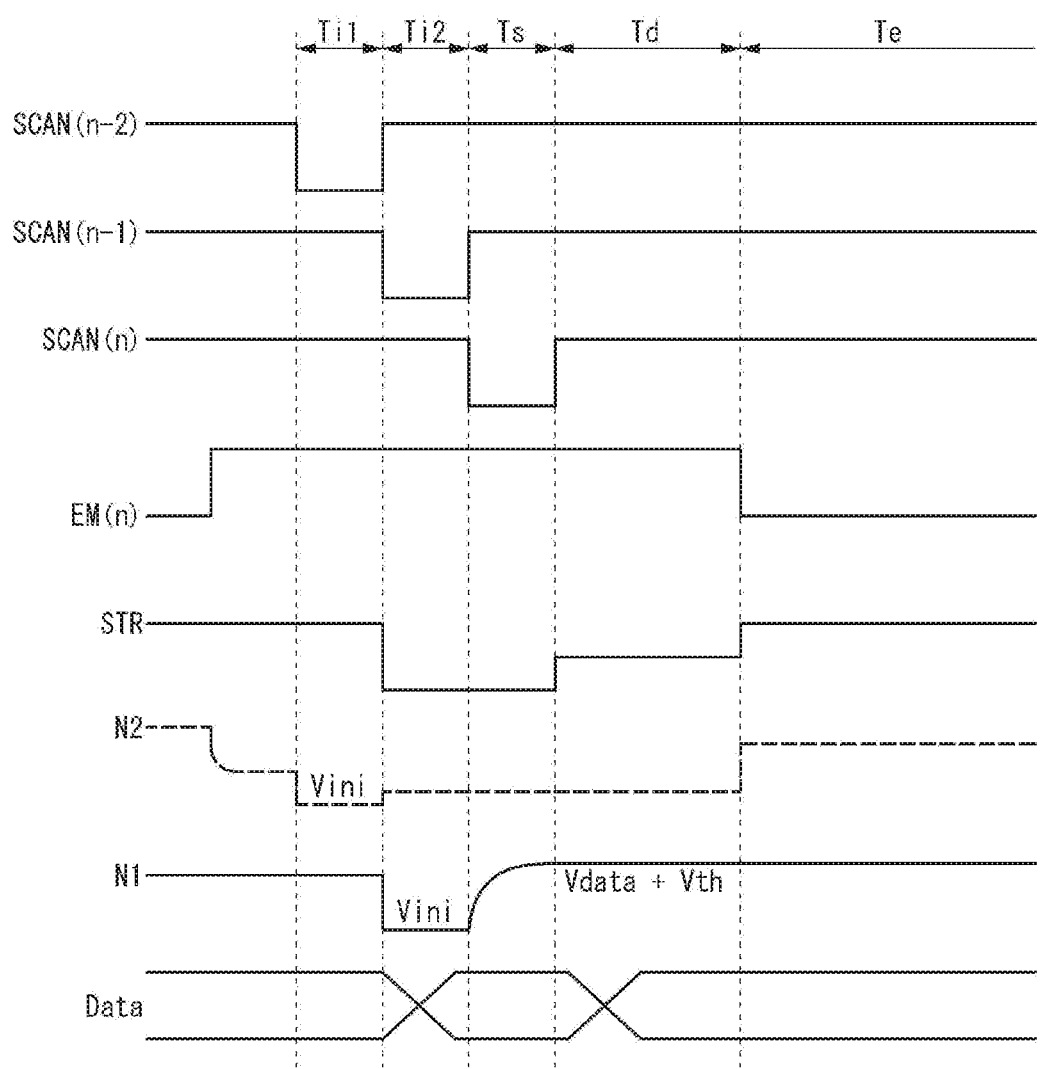
FIG. 10 is a diagram illustrating the operation timings of driving signals and the voltage changes of main nodes according to the first embodiment of the present disclosure.
Figure 11A:
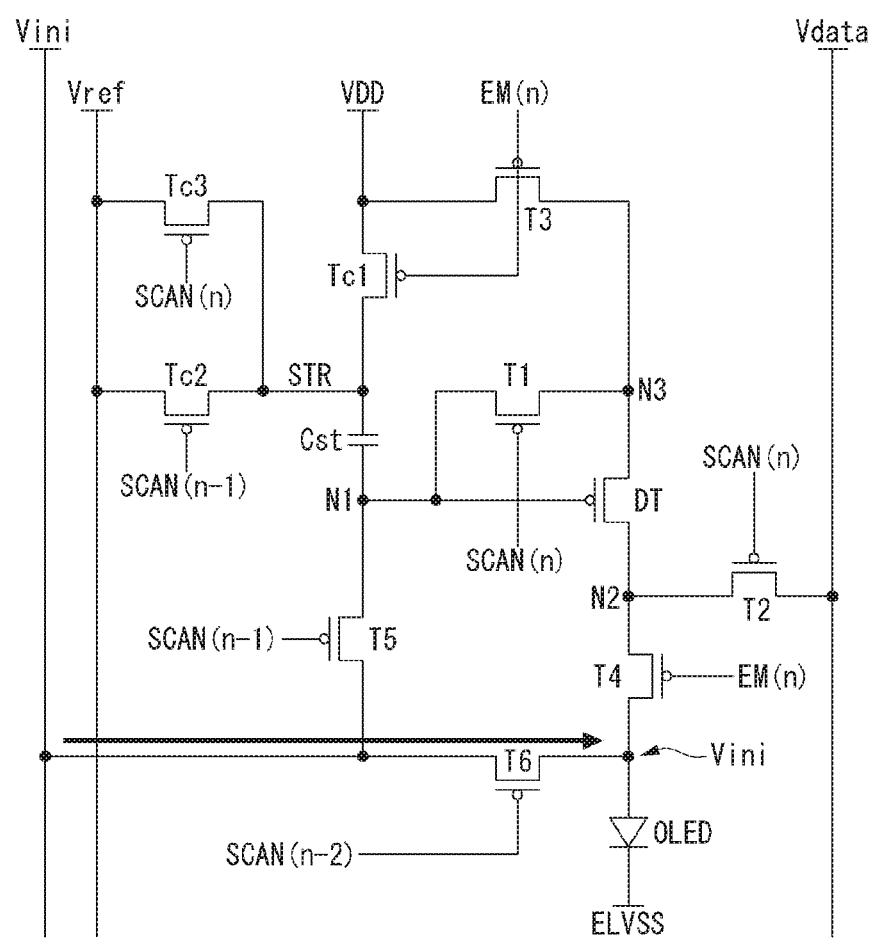
FIGS. 11A to 11D are views for explaining the operations of the second pixel circuit in an image displaying period.
Figure 11B:
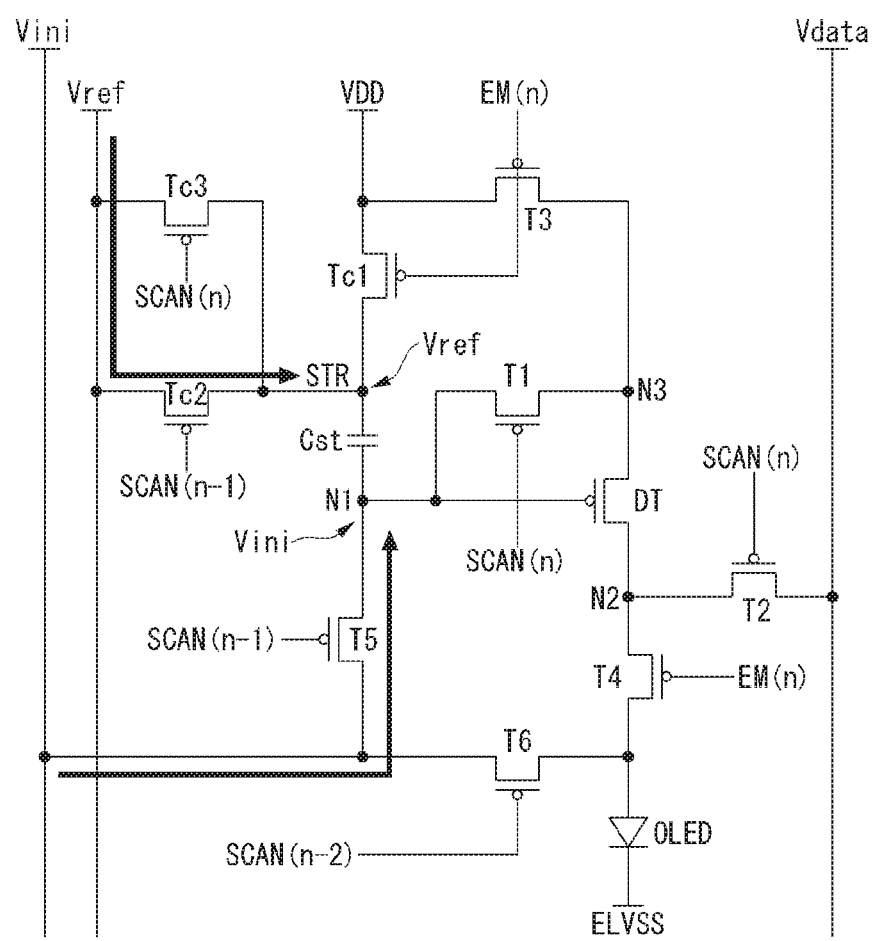
Figure 11C:
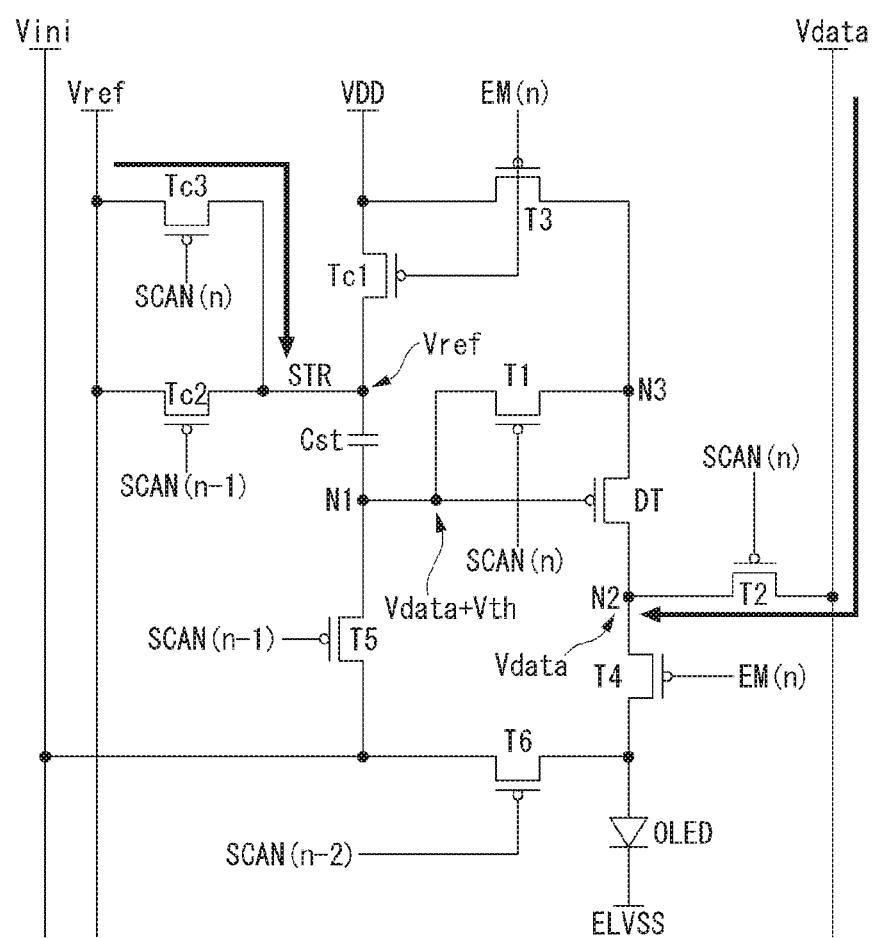
Figure 11D:
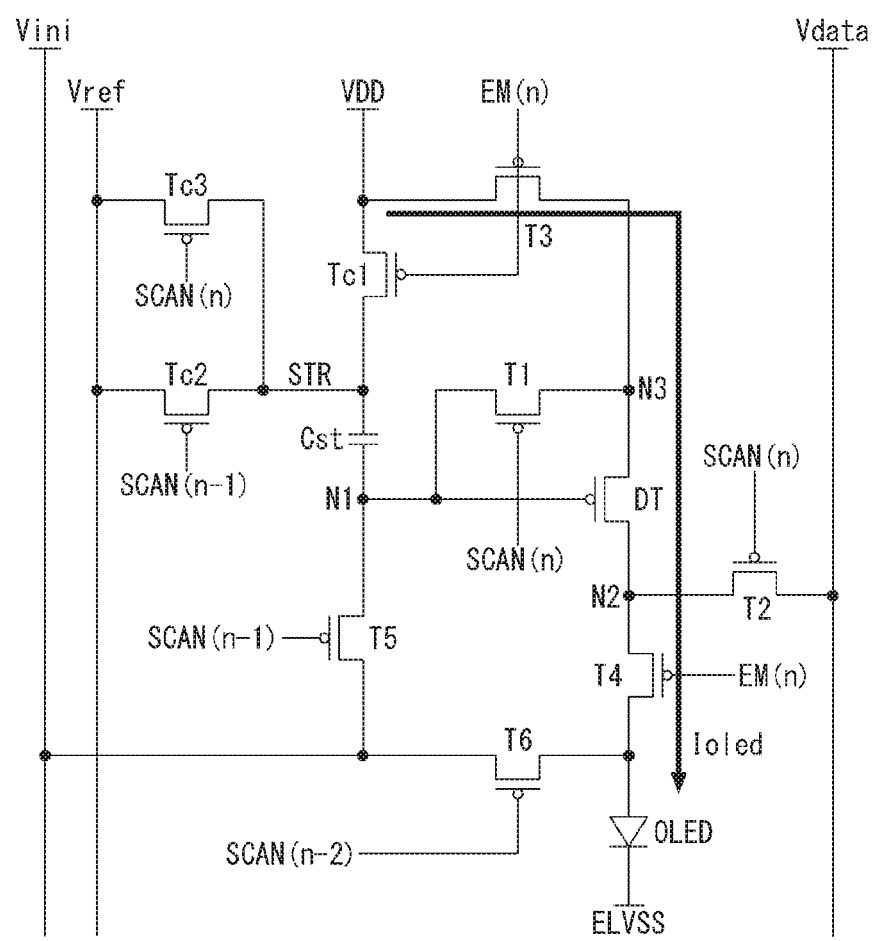

FIG. 10 is a diagram illustrating the timings of gate signals in the displaying period according to the second embodiment, and FIGS. 11A to 11D are equivalent circuit diagrams of pixels in a first initialization period, a second initialization period, a sampling period, and a light emission period, respectively. Hereinafter, in the second embodiment, the same reference numerals and names are used for components substantially the same as those in the first embodiment described above.

Referring to FIGS. 8 to 11D, the operations of the pixel are as follows which emits light while compensating for the threshold voltage change of the driving transistor in real time.

Referring to FIGS. 8 to 10 and 11A, in the first initialization period Ti1, the (n-2)-th scan signal SCAN(n-2) maintains a turn-on voltage. The sixth transistor T6 applies the initialization voltage Vini to the anode of the OLED in response to the (n-2)-th scan signal SCAN(n-2). As a result, the anode of the OLED is initialized to the initialization voltage Vini in the first initializing period Ti1. The initialization voltage Vini is selected within a voltage range sufficiently lower than the operation voltage of the OLED and can be set to be equal to or lower than the low potential voltage ELVSS.

Referring to FIGS. 8 to 10 and 11B, the (n-1)-th scan signal SCAN(n-1) maintains the turn-on voltage in the second initialization period Ti2. The fifth transistor T5 applies the initialization voltage Vini to the first node N1 in response to the (n-1)-th scan signal SCAN(n-1). In the second initializing period Ti2, the first node N1 is initialized to the initialization voltage Vini. The second compensation transistor Tc2 applies the reference voltage Vref to the compensation node STR in response to the (n-1)-th scan signal SCAN(n-1). The reference voltage Vref can be set to a voltage lower than the high potential voltage VDD.

Referring to FIGS. 8 to 10 and 11C, in the sampling period Ts, the n-th scan signal SCAN(n) maintains the turn-on voltage. The first transistor T1 connects the first node N1 and the third node N3 in response to the n-th scan signal SCAN(n). The second transistor T2 writes a data voltage Vdata to the second node N2 in response to the n-th scan signal SCAN(n). A current flows between the drain and source electrodes of the driving transistor DT in the sampling period Ts, and this current flows until the voltage of the source electrode is saturated to the magnitude of the sum (Vdata+Vth) of the data voltage Vdata and the threshold voltage Vth of the driving transistor DT. That is, during the sampling period Ts, the gate electrode of the driving transistor DT is sampled with a magnitude of (Vdata+Vth).

The third compensation transistor Tc3 applies the reference voltage Vref to the compensation node STR in response to the n-th scan signal SCAN(n).

Referring to FIGS. 8 to 10 and 11D, the n-th emission signal EM(n) maintains the turn-on voltage in the emission period Te after a holding period Td. The third transistor T3 and the fourth transistor T4 are turned on in response to the n-th emission signal EM(n), and as a result, a current is generated from the input terminal of the high potential voltage VDD to the anode of the OLED depending on the voltage set between the gate and the source of the driving transistor DT.

The first compensation transistor Tc1 applies the high potential voltage VDD to the compensation node STR in response to the n-th emission signal EM(n).

Since the compensation node STR is charged with the reference voltage Vref in the sampling period Ts, in the emission period Te the voltage of the compensation node STR rises by the magnitude of (VDD−Vref) in comparison with the sampling period Ts. Since the voltage change amount of the compensation node STR is reflected to the first node N1 by coupling phenomenon, a voltage change of an amount of (VDD−Vref) occurs in the first node N1. That is, the voltage of the first node N1 becomes (Vdata+Vth+VDD−Vref) in the emission period Te from (Vdata+Vth) in the sampling period Ts.

As a result, the driving current Ioled flowing in the OLED in the emission period Te is expressed by the following Equation 2.

$$IOLED = k/2\{(Vgs-Vth)\}^2 = k/2\{(Vg-Vs-Vth)\}^2 = k/2\{(Vdata+Vth+VDD-Vref)-VDD-Vth\}^2 = k/2\{(Vdata-Vref)\}^2 \quad \text{Equation 2}$$

At this time, since Vth<0, Equation 2 becomes $k/2\{(Vdata-VDD)\}^2$.

In Equation 2, k represents a proportional constant determined by electron mobility, parasitic capacitance, and channel capacitance of the driving transistor DT, and the like. As a result, during the light emission period Te, the driving current flowing through the OLED is not affected by the threshold voltage Vth of the driving transistor DT.

The pixel circuit according to the first embodiment compensates for the threshold voltage deviation of the OLED within the sensing period, similar to the first embodiment. The method of sensing the anode voltage of the organic light emitting diode in the second embodiment can be the same as that of the first embodiment.

As a result, the organic light emitting diode display device according to the second embodiment does not require additional patterns and switch elements and can perform a sensing operation using only the configuration of an internal compensation circuit necessary during a displaying period. Since a sensing voltage is obtained by using a data line, an initialization line can be disposed as a horizontal line. Since a longitudinal width is wider than a lateral width in the shape of the pixel, the design margin is larger when the initialization line is arranged as the horizontal line, which is advantageous for realizing high resolution.

Throughout the description, it should be understood by those skilled in the art that various changes and modifications are possible without departing from the technical principles of the present disclosure. Therefore, the technical scope of the present disclosure is not limited to the detailed descriptions in this specification but should be defined by the scope of the appended claims.

What is claimed is:

1. An organic light emitting display device, comprising:
pixels connected to a data line and a scan line,
wherein an n-th pixel disposed on an n-th pixel line, n being an integer, comprises:
  a driving transistor including a gate electrode connected to a first node, a drain electrode connected to a second node and a source electrode connected to a third node;
  an organic light emitting diode (OLED) connected to the second node;
  a first transistor connected between the first node and the third node, a drain electrode of the first transistor being directly connected to the gate electrode of the driving transistor and a source electrode of the first transistor being directly connected to the source electrode of the driving transistor;
  a scan transistor connected between the data line and the second node;
  a first emission control transistor connected between the second node and the OLED; and
  a second emission control transistor connected between a high potential voltage and the third node,
wherein the source electrode of the first transistor is directly connected between a drain electrode of the second emission control transistor and the source electrode of the driving transistor, wherein the third node is connected to an input terminal of the high potential voltage,
wherein the drain electrode of the driving transistor is connected to the data line via the scan transistor being directly connected to the drain electrode of the driving transistor, and the source electrode of the driving transistor is connected to the high potential voltage via the second emission control transistor, and
wherein the n-th pixel further comprises a capacitor including a first electrode directly connected to the input terminal of the high potential voltage and a second electrode directly connected to the first node.

2. The organic light emitting display device of claim 1, wherein, during a sampling period, the scan transistor of the nth pixel applies a data voltage provided through the data line to the second node in response to an n-th scan signal, and the first transistor of the n-th pixel connects the first node and the third node in response to the n-th scan signal.

3. The organic light emitting display device of claim 2, wherein, during an emission period following the sampling period, the first emission control transistor of the n-th pixel connects the input terminal of the high potential voltage and the third node in response to an n-th emission signal, and the second emission control transistor of the n-th pixel connects the second node and an anode electrode of the OLED in response to the nth emission signal.

4. The organic light emitting display device of claim 2, wherein the nth pixel further comprises a first initialization transistor connected between an initialization line and an anode electrode of the OLED, and wherein the first initialization transistor of the n-th pixel applies an initialization voltage from the initialization line to anode electrode of the OLED in response to an (n-2)-th scan signal, during a first initialization period before the sampling period.

5. The organic light emitting display device of claim 4, wherein the (n-2)-th scan signal turns on a scan transistor disposed on an (n-2)-th pixel line.

6. The organic light emitting display device of claim 4, wherein the n-th pixel further comprises a second initialization transistor connected between the initialization line and the first node, and wherein the second initialization transistor of the nth pixel applies the initialization voltage to the first node in response to an (n-1)-th scan signal, during a second initialization period following the first initialization period.

7. The organic light emitting display device of claim 6, wherein the (n-1)-th scan signal turns on a scan transistor disposed on an (n-1)-th pixel line.

8. The organic light emitting display device of claim 7, wherein a second initialization transistor of a pixel disposed on the (n-1)th pixel line is provided with the (n-1) scan signal through an (n-1)-th scan line, and
  wherein a gate electrode of the first initialization transistor of the n-th pixel is connected to the (n-1)-th scan line disposed on the (n-1)-th pixel line.

9. The organic light emitting display device of claim 1, wherein the n-th pixel comprises:
  a first compensation transistor connected between the first electrode of the capacitor and the input terminal of the high potential voltage;
  a second compensation transistor connected between the first electrode of the capacitor and an input terminal of the (n-1)th scan signal; and
  a third compensation transistor connected between the first electrode of the capacitor and an input terminal of the n-th scan signal.

10. The organic light emitting display device of claim 1, further comprising:
  a digital-to-analog converter (DAC) configured to supply a data voltage for displaying to the data line in a displaying period, and supply a data voltage for sensing to the data line in a sensing period; and
  a sensing unit configured to obtain an anode voltage of the OLED as a sensing voltage through the data line in the sensing period.

11. The organic light emitting display device of claim 10, further comprising:
  a first switch connected between the data line and the DAC, and turned on during a first period within the sensing period; and
  a second switch connected between the data line and the sensing unit, and turned on during a second period following the first period within the sensing period.

12. The organic light emitting display device of claim 1, wherein a source electrode of the scan transistor is connected to the data line and a drain electrode of the scan transistor is connected to the drain electrode of the driving transistor.

13. An organic light emitting display device, comprising:
pixels connected to a data line and a scan line,
wherein an n-th pixel disposed on an n-th pixel line, n being an integer, comprises:
  a driving transistor including a gate electrode connected to a first node, a drain electrode connected to a second node and a source electrode connected to a third node;

an organic light emitting diode (OLED) connected to the second node;

a first transistor connected between the first node and the third node, a drain electrode of the first transistor being directly connected to the gate electrode of the driving transistor and a source electrode of the first transistor being directly connected to the source electrode of the driving transistor;

a scan transistor connected between the data line and the second node, a source electrode of the scan transistor being directly connected to the data line and a drain electrode of the scan transistor being directly connected to the drain electrode of the driving transistor;

a first emission control transistor connected between the second node and the OLED, a second emission control transistor connected between a high potential voltage and the third node, wherein the third node is connected to an input terminal of the high potential voltage, wherein the drain electrode of the driving transistor is connected to the data line via the scan transistor being directly connected to the drain electrode of the driving transistor, and the source electrode of the driving transistor is connected to the high potential voltage via the second emission control transistor by having the source electrode of the driving transistor directly connected to a drain electrode of the second emission control transistor, and wherein the n-th pixel further comprises a capacitor including a first electrode directly connected to the input terminal of the high potential voltage and a second electrode directly connected to the first node.

14. The organic light emitting display device of claim 3, wherein, during a sampling period, the scan transistor of the n-th pixel applies a data voltage provided through the data line to the second node in response to an n-th scan signal, and the first transistor of the n-th pixel connects the first node and the third node in response to the nth scan signal.

15. The organic light emitting display device of claim 14, wherein, during an emission period following the sampling period, the first emission control transistor of the nth pixel connects the high potential voltage and the third node in response to an n-th emission signal, and the second emission control transistor of the nth pixel connects the second node and an anode electrode of the OLED in response to the n-th emission signal.

16. The organic light emitting display device of claim 13, further comprising:

a digital-to-analog converter (DAC) configured to supply a data voltage for displaying to the data line in a displaying period, and supply a data voltage for sensing to the data line in a sensing period; and a sensing unit configured to obtain an anode voltage of the OLED as a sensing voltage through the data line in the sensing period.

* * * * *